United States Patent
Noguchi (10) Patent No.: US 12,431,866 B2
(45) Date of Patent: Sep. 30, 2025

(54) ACOUSTIC WAVE FILTER

(71) Applicant: Murata Manufacturing Co., Ltd., Nagaokakyo (JP)

(72) Inventor: Akira Noguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 280 days.

(21) Appl. No.: 18/121,632

(22) Filed: Mar. 15, 2023

(65) Prior Publication Data
US 2024/0088872 A1    Mar. 14, 2024

Related U.S. Application Data

(63) Continuation of application No. PCT/JP2021/033530, filed on Sep. 13, 2021.

(30) Foreign Application Priority Data

Sep. 17, 2020    (JP) .................................. 2020-156362

(51) Int. Cl.
*H03H 9/56*    (2006.01)
*H03H 9/13*    (2006.01)
*H03H 9/70*    (2006.01)

(52) U.S. Cl.
CPC ............ *H03H 9/568* (2013.01); *H03H 9/133* (2013.01); *H03H 9/70* (2013.01)

(58) Field of Classification Search
CPC ........... H03H 9/70; H03H 9/133; H03H 9/568
USPC ................................................ 333/186, 193
See application file for complete search history.

(56) References Cited

U.S. PATENT DOCUMENTS

| | | | |
|---|---|---|---|
| 2003/0042999 A1* | 3/2003 | Takamine | H03H 9/0038 333/195 |
| 2013/0113576 A1 | 5/2013 | Inoue et al. | |
| 2014/0113571 A1 | 4/2014 | Fujiwara et al. | |
| 2018/0131349 A1 | 5/2018 | Takata | |
| 2021/0021256 A1* | 1/2021 | Okada | H03H 9/725 |
| 2021/0167750 A1 | 6/2021 | Takata | |

FOREIGN PATENT DOCUMENTS

| | | |
|---|---|---|
| JP | 2014082700 A | 5/2014 |
| JP | 2014120841 A | 6/2014 |
| JP | 2016220263 A | 12/2016 |

(Continued)

OTHER PUBLICATIONS

International Search Report in PCT/JP2021/033530, mailed Nov. 22, 2021, 3 pages.

(Continued)

*Primary Examiner* — Rakesh B Patel
(74) *Attorney, Agent, or Firm* — Keating & Bennett, LLP (57) ABSTRACT

An acoustic wave filter includes a first filter circuit with a predetermined frequency band as a pass band and provided on a first path connecting first and second signal terminals, and an additional resonant circuit connected in parallel with at least a portion of the first filter circuit. The additional resonant circuit includes an IDT electrode group including IDT electrodes positioned along an acoustic wave propagation direction. At least one resonant frequency of one or more resonant frequencies of the additional resonant circuit is included within the pass band of the first filter circuit.

20 Claims, 7 Drawing Sheets

(56) References Cited

FOREIGN PATENT DOCUMENTS

| | | |
|---|---|---|
| JP | 2018074539 A | 5/2018 |
| WO | 2020044979 A1 | 3/2020 |

OTHER PUBLICATIONS

Written Opinion in PCT/JP2021/033530, mailed Nov. 22, 2021, 4 pages.

Official Communication issued in corresponding Chinese Patent Application No. 202180063036.2, mailed on Jun. 5, 2025, 5 pages.

\* cited by examiner

ACOUSTIC WAVE FILTER

CROSS REFERENCE TO RELATED APPLICATIONS

This application claims the benefit of priority to Japanese Patent Application No. 2020-156362 filed on Sep. 17, 2020 and is a Continuation Application of PCT Application No. PCT/JP2021/033530 filed on Sep. 13, 2021. The entire contents of each application are hereby incorporated herein by reference.

BACKGROUND OF THE INVENTION

1. Field of the Invention

The present invention relates to an acoustic wave filter including an acoustic wave resonator.

2. Description of the Related Art

In the related art, there is an acoustic wave filter including an acoustic wave resonator. As an example of this type of acoustic wave filter, Japanese Unexamined Patent Application Publication No. 2018-74539 discloses an acoustic wave filter including a filter circuit having a predetermined frequency band as a pass band, and a cancel circuit connected in parallel with the filter circuit. This acoustic wave filter enables improvements in attenuation characteristics and isolation characteristics of the filter circuit.

SUMMARY OF THE INVENTION

In the acoustic wave filter disclosed in Japanese Unexamined Patent Application Publication No. 2018-74539, however, as illustrated in FIG. 5 in Japanese Unexamined Patent Application Publication No. 2018-74539, a resonant frequency of the cancel circuit is located on a high frequency side far away from the pass band of the filter circuit. For this reason, in this acoustic wave filter, it is difficult to reduce insertion loss within the pass band.

Preferred embodiments of the present invention provide acoustic wave filters that each reduces or prevents insertion loss within a pass band of a filter circuit.

An acoustic wave filter according to an aspect of a preferred embodiment of the present invention includes a filter circuit with a predetermined frequency band as a pass band and provided on a first path connecting a first signal terminal and a second signal terminal, and an additional resonant circuit connected in parallel with at least a portion of the filter circuit. The additional resonant circuit includes an IDT electrode group including a plurality of IDT electrodes positioned along an acoustic wave propagation direction. At least one resonant frequency of one or more resonant frequencies of the additional resonant circuit is included within the pass band of the filter circuit.

An acoustic wave filter according to a preferred embodiment of the present invention enables a reduction in insertion loss within the pass band of the filter circuit.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the drawings. Incidentally, all of the preferred embodiments described below describe comprehensive or specific examples. Numerical values, shapes, materials, components, the arrangement and connection configuration of the components, and so forth that are described in the following preferred embodiments are merely examples and are not intended to limit the present invention. Of components in the following preferred embodiments, a component not described in an independent claim is described as an optional component. Furthermore, the sizes or size ratio of components illustrated in drawings are or is not necessarily exact. Additionally, in figures, components that are substantially the same are denoted by the same reference signs, and a repeated description is omitted or simplified in some cases. Furthermore, in the following preferred embodiments, when an element is referred to as being "connected" to another element, the element can not only be directly connected to the other element, but also electrically via another element or the like.

Preferred Embodiments

1. Configuration of Multiplexer

A configuration of a multiplexer including an acoustic wave filter according to a preferred embodiment of the present invention will be described with reference to FIG. 1.

Figure 1:
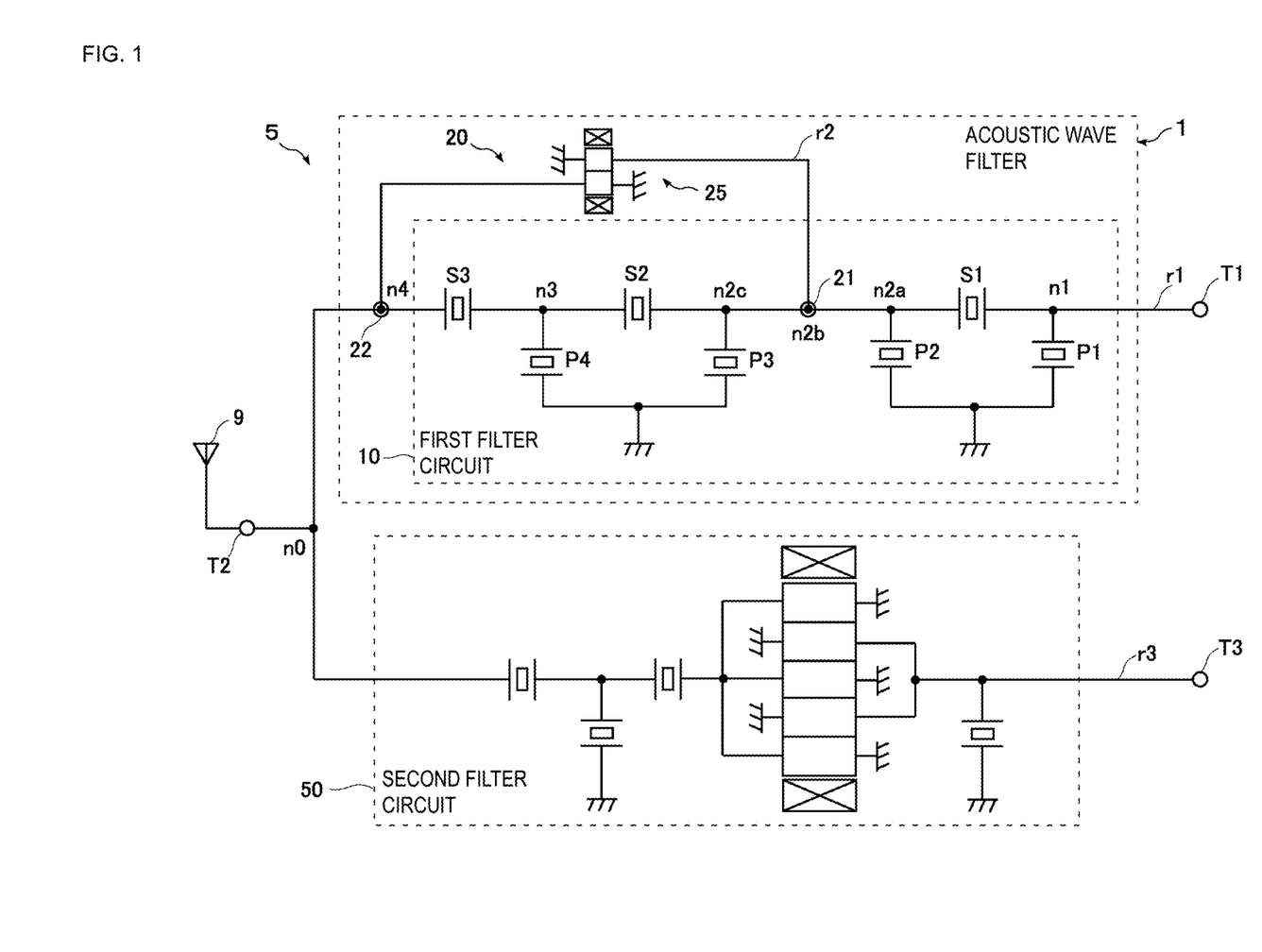
FIG. 1 is a circuit configuration diagram of a multiplexer including an acoustic wave filter according to a preferred embodiment of the present invention.

FIG. 1 is a circuit configuration diagram of a multiplexer 5 including an acoustic wave filter 1 according to the present preferred embodiment. Incidentally, FIG. 1 also illustrates an antenna element 9.

The multiplexer 5 is a splitter or combiner including a plurality of filters. The multiplexer 5 includes the acoustic wave filter 1 including a first filter circuit 10 and an additional resonant circuit 20, and a second filter circuit 50. The first filter circuit 10 is a filter circuit having a predetermined frequency band as a pass band.

Furthermore, the multiplexer 5 includes a first signal terminal T1, a second signal terminal T2, and a third signal terminal T3.

The first signal terminal T1 is connected to the acoustic wave filter 1. Furthermore, the first signal terminal T1 is connected to an RF signal processing circuit (not illustrated), for example, via an amplifier circuit (not illustrated) outside the multiplexer 5.

The second signal terminal T2 is a common terminal connected to each of the acoustic wave filter 1 and the second filter circuit 50. Specifically, the second signal terminal T2 is connected to the acoustic wave filter 1 via a node n0 between the acoustic wave filter 1 and the second signal terminal T2 and is further connected to the second filter circuit 50 via the node n0. Furthermore, the second signal terminal T2 is connected to the antenna element 9 outside the multiplexer 5. The second signal terminal T2 is also an antenna terminal of the multiplexer 5.

The third signal terminal T3 is connected to the second filter circuit 50. Furthermore, the third signal terminal T3 is connected to an RF signal processing circuit (not illustrated), for example, via an amplifier circuit (not illustrated) outside the multiplexer 5.

The acoustic wave filter 1 is located on a first path r1 connecting the first signal terminal T1 and the second signal terminal T2. The acoustic wave filter 1 is a transmission filter having, for example, an uplink frequency band (transmission band) as a pass band and is configured so that its pass band is lower than that of the second filter circuit 50. The pass band of the acoustic wave filter 1 is the same as a pass band of the first filter circuit 10.

The acoustic wave filter 1 includes the first filter circuit 10, and the additional resonant circuit 20 additionally connected to the first filter circuit 10. The additional resonant circuit 20 is a circuit to cancel an unwanted wave outside the pass band of the first filter circuit 10. The additional resonant circuit 20 has a plurality of resonant frequencies (resonance points). At least one resonant frequency of one or more resonant frequencies of the additional resonant circuit 20 is included within the pass band of the first filter circuit 10. A resonant frequency of the additional resonant circuit 20 will be described later.

The second filter circuit 50 is located on a third path r3 connecting the second signal terminal T2 and the third signal terminal T3. The second filter circuit 50 has, as a pass band, a frequency band different from the pass band of the first filter circuit 10. The second filter circuit 50 is a reception filter having, for example, a downlink frequency band (reception band) as a pass band. The second filter circuit 50 includes, for example, by a plurality of series-arm resonators, a plurality of parallel-arm resonators, and a longitudinally coupled acoustic wave resonator.

Each of the acoustic wave filter 1 and the second filter circuit 50 has to have characteristics in which frequencies in its own band are passed and frequencies in another band located outside its own band are attenuated.

2. Configuration of Acoustic Wave Filter

Next, a configuration of the acoustic wave filter 1 will be described with reference to FIGS. 1 and 2.

As illustrated in FIG. 1, the acoustic wave filter 1 includes the first filter circuit 10 and the additional resonant circuit 20.

The first filter circuit 10 includes series-arm resonators S1, S2, and S3 and parallel-arm resonators P1, P2, P3, and P4, which are acoustic wave resonators.

The series-arm resonators S1 to S3 are disposed on the first path r1 (series arm) connecting the first signal terminal T1 and the second signal terminal T2. The series-arm resonators S1 to S3 are connected in series in this order from the first signal terminal T1 toward the second signal terminal T2.

The parallel-arm resonators P1 to P4 are connected in parallel with one another on paths (parallel arms) connecting respective nodes n1, n2a, n2c, and n3 between the first signal terminal T1 and the series-arm resonators S1 to S3 arranged on the first path r1 and reference terminals (grounds). Specifically, of the parallel-arm resonators P1 to P4, one end of the parallel-arm resonator P1 closest to the first signal terminal T1 is connected to the node n1 between the first signal terminal T1 and the series-arm resonator S1, and the other end is connected to a reference terminal. One end of the parallel-arm resonator P2 is connected to the node n2a between the series-arm resonators S1 and S2, and the other end is connected to a reference terminal. One end of the parallel-arm resonator P3 is connected to the node n2c between the series-arm resonators S1 and S2, and the other end is connected to a reference terminal. One end of the parallel-arm resonator P4 is connected to the node n3 between the series-arm resonators S2 and S3, and the other end is connected to a reference terminal. Incidentally, the reference terminals on other end sides of the parallel-arm resonators P1 and P2 are connected in common, and the reference terminals on other end sides of the parallel-arm resonators P3 and P4 are connected in common. The nodes n2a and n2c, and a node n2b to be described may be the same node.

Thus, the first filter circuit 10 has a n-type ladder filter structure including three series-arm resonators S1 to S3 on the first path r1 and four parallel-arm resonators P1 to P4 on the paths connecting the first path r1 and the reference terminals.

Incidentally, for the series-arm resonators and parallel-arm resonators of the first filter circuit 10, the number of series-arm resonators and the number of parallel-arm resonators are not limited to three or four. One or more series-arm resonators and two or more parallel-arm resonators may only be provided. Furthermore, an inductor may be provided between a parallel-arm resonator and a reference terminal. In FIG. 1, some of the reference terminals to which the parallel-arm resonators are connected are connected in common. However, a decision on whether reference terminals are to be connected in common or individually can be made appropriately, for example, in accordance with a constraint of an installation layout of the first filter circuit 10.

Next, the additional resonant circuit 20 of the acoustic wave filter 1 will be described. The additional resonant circuit 20 is a circuit that applies an opposite phase to an unwanted wave outside the pass band of the first filter circuit 10 to thus keep the unwanted wave from being output from the acoustic wave filter 1.

The additional resonant circuit 20 is connected to a plurality of different nodes on the first path r1 so as to be connected in parallel with at least a portion of the first filter circuit 10. The additional resonant circuit 20 includes a first terminal 21, which is a connection node on one end side of the additional resonant circuit 20, a second terminal 22, which is a connection node on the other end side, and an IDT (InterDigital Transducer) electrode group 25 disposed on a second path r2 connecting the first terminal 21 and the second terminal 22. Incidentally, a terminal herein refers to a point where radio frequency signals enter or leave the additional resonant circuit 20.

Each of the first terminal 21 and the second terminal 22 are electrically connected to the IDT electrode group 25. That is, a plurality of IDT electrodes of the IDT electrode group 25 are each connected directly to the first path r1 via the second path r2, for example, without any capacitance element.

Furthermore, the first terminal 21 and the second terminal 22 are connected to respective different nodes on the first path r1. In FIG. 1, the first terminal 21 is connected to the node n2b between the series-arm resonators S1 and S2, and the second terminal 22 is connected to a node n4 between the series-arm resonator S3 and the second signal terminal T2.

Figure 2:
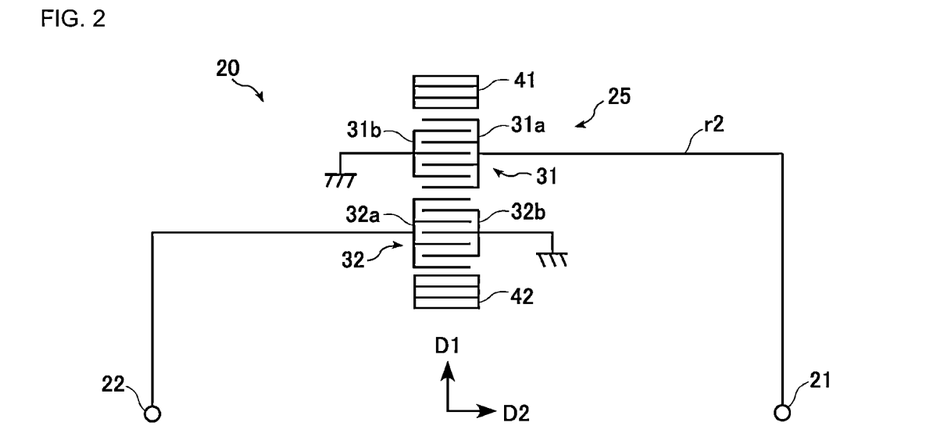
FIG. 2 is a schematic diagram illustrating an IDT electrode group included in an additional resonant circuit of a acoustic wave filter according to a preferred embodiment of the present invention.

FIG. 2 is a schematic diagram illustrating the IDT electrode group 25 included in the additional resonant circuit 20 of the acoustic wave filter 1. Incidentally, in FIG. 2, an electrode and a line are represented by solid lines.

As described above, the additional resonant circuit 20 includes the IDT electrode group 25. The IDT electrode group 25 is an acoustic wave resonator group including a plurality of IDT electrodes 31 and 32. The IDT electrode group 25 includes, for example, at least one longitudinally coupled resonator. The plurality of IDT electrodes 31 and 32 are adjacent to each other along an acoustic wave propagation direction D1. Electrode parameters of the plurality of IDT electrodes 31 and 32 are different from each other.

Furthermore, the additional resonant circuit 20 includes a plurality of reflectors 41 and 42. The plurality of reflectors 41 and 42 are located, in the acoustic wave propagation direction D1, on both outer sides of the IDT electrode group 25 so that the IDT electrode group 25 is interposed therebetween. In FIG. 2, the additional resonant circuit 20 including two reflectors 41 and 42 is exemplified.

The plurality of IDT electrodes 31 and 32 include a plurality of first comb-shaped electrodes 31a and 32a and a plurality of second comb-shaped electrodes 31b and 32b. Of the plurality of IDT electrodes 31 and 32, the IDT electrode 31 includes a pair of the first comb-shaped electrode 31a and the second comb-shaped electrode 31b. On the other hand, the IDT electrode 32 includes a pair of the first comb-shaped electrode 32a and the second comb-shaped electrode 32b.

The first comb-shaped electrode 31a and the second comb-shaped electrode 31b face each other. The first comb-shaped electrode 32a and the second comb-shaped electrode 32b face each other.

The plurality of first comb-shaped electrodes 31a and 32a are electrically connected to a plurality of different nodes on the first path r1. Specifically, the first comb-shaped electrode 31a is connected to the node n2b via the first terminal 21, and the first comb-shaped electrode 32a is connected to the node n4 via the second terminal 22. On the other hand, each of the second comb-shaped electrodes 31b and 32b is connected to a ground.

Incidentally, although an example has been described above where the first terminal 21 of the additional resonant circuit 20 is connected to the node n2b and the second terminal 22 is connected to the node n4, connections of the terminals are not limited to this. The first terminal 21 and the second terminal 22 may only be connected to nodes on both outer sides of two or more adjacent series-arm resonators on the first path r1. For example, the first terminal 21 may be connected to the node n1 on the first path r1 connecting the first signal terminal T1 and the series-arm resonator S1 or may be connected to the node n3. For example, the second terminal 22 may be connected to the node n3.

3. Structure of IDT Electrode Group of Additional Resonant Circuit

Figure 3:
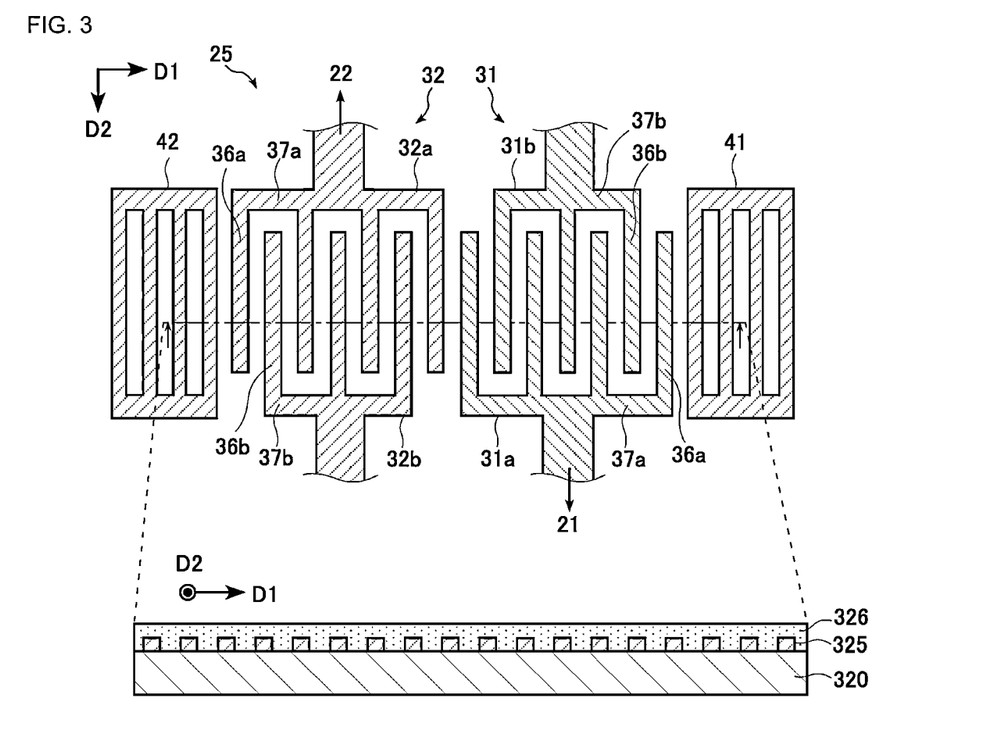
FIG. 3 includes a plan view and a cross-sectional view schematically illustrating the structure of the IDT electrode group illustrated in FIG. 2.

Next, the structure of the IDT electrode group 25 included in the additional resonant circuit 20 will be described. The IDT electrode group 25 includes, for example, a plurality of surface acoustic wave (SAW) resonators.

FIG. 3 includes a plan view and a cross-sectional view schematically illustrating the structure of the IDT electrode group 25. Incidentally, the IDT electrode group 25 illustrated in FIG. 3 is intended to describe a typical structure of a resonator, and the number of electrode fingers included in an IDT electrode and a reflector, the length of each electrode finger, and so forth are not limited to this.

The IDT electrode group 25 includes a substrate 320 having piezoelectricity, and the plurality of IDT electrodes 31 and 32 on the substrate 320. On both outer sides of the IDT electrode group 25 in the acoustic wave propagation direction D1, the plurality of reflectors 41 and 42 are provided.

As illustrated in the cross-sectional view in FIG. 3, the IDT electrode group 25 and electrodes of the plurality of reflectors 41 and 42 are defined by the substrate 320, an electrode layer 325, and a dielectric layer 326. The electrode layer 325 defines each of the IDT electrodes 31 and 32 and the electrodes of the plurality of reflectors 41 and 42. The dielectric layer 326 is provided on the substrate 320 so as to cover each of the IDT electrodes 31 and 32 and each of the reflectors 41 and 42.

The substrate 320 is a LiNbO$_3$ substrate (lithium niobate substrate), for example, with a cut-angle of about 127.5°. When a Rayleigh wave is used as an acoustic wave that propagates through the substrate 320, it is desirable that a cut-angle of the substrate 320 be about 120°±20° or about 300°±20°, for example.

The electrode layer 325 has a structure in which a plurality of metal layers are laminated. The electrode layer 325 is formed by laminating, for example, a Ti layer, an Al layer, a Ti layer, a Pt layer, and an NiCr layer in this order from top to bottom.

The dielectric layer 326 is a film mainly including, for example, silicon dioxide (SiO$_2$). The dielectric layer 326 is provided, for example, to adjust frequency-temperature characteristics of the IDT electrode group 25, to protect the electrode layer 325 from an external environment, or to increase resistance to moisture.

As illustrated in the plan view in FIG. 3, the IDT electrode 31 includes a pair of the first comb-shaped electrode 31a and the second comb-shaped electrode 31b that face each other. The IDT electrode 32 includes a pair of the first comb-shaped electrode 32a and the second comb-shaped electrode 32b that face each other.

Each of the first comb-shaped electrodes 31a and 32a has a comb shape and includes a plurality of electrode fingers 36a that are parallel or substantially parallel to one another and a busbar electrode 37a that connects one ends of the plurality of respective electrode fingers 36a. Each of the second comb-shaped electrodes 31b and 32b has a comb shape and includes a plurality of electrode fingers 36b that are parallel or substantially parallel to one another and a busbar electrode 37b that connects one ends of the plurality of respective electrode fingers 36b. Each of the busbar electrodes 37a and 37b extends along the acoustic wave propagation direction D1. The plurality of electrode fingers 36a and 36b extend along a direction D2 perpendicular or substantially perpendicular to the acoustic wave propagation direction D1. The plurality of electrode fingers 36a and 36b interdigitate with each other in the orthogonal direction D2 and face each other in the acoustic wave propagation direction D1.

The first comb-shaped electrode 31a is connected to the first terminal 21 via a line, and the first comb-shaped electrode 32a is connected to the second terminal 22 via a line. The second comb-shaped electrode 31b is connected to the ground via a line, and the second comb-shaped electrode 32b is connected to the ground via a line. Incidentally, the ground may be a ground connection electrode (not illustrated) provided, for example, in or on a board of the multiplexer 5.

A resonant frequency of the additional resonant circuit 20 can be adjusted, for example, by changing a pitch ($\lambda/2$) between a plurality of electrode fingers 36a and 36b, or an intersecting width of the plurality of electrode fingers 36a and 36b.

4. Bandpass Characteristics and Others of Acoustic Wave Filter

Bandpass characteristics and others of the acoustic wave filter 1 according to the present preferred embodiment will be described.

Figure 4:
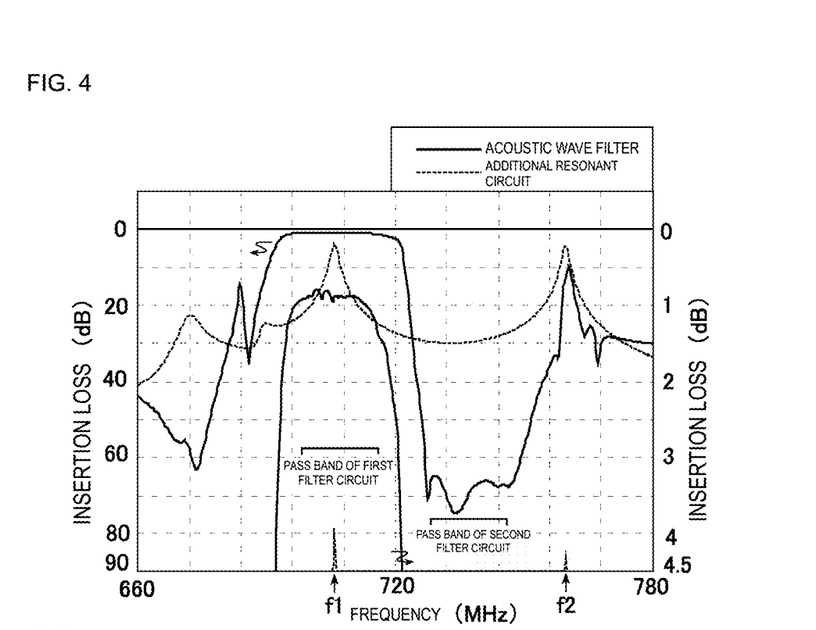
FIG. 4 is a graph illustrating insertion losses of an acoustic wave filter and an additional resonant circuit according to a preferred embodiment of the present invention.
Figure 5:
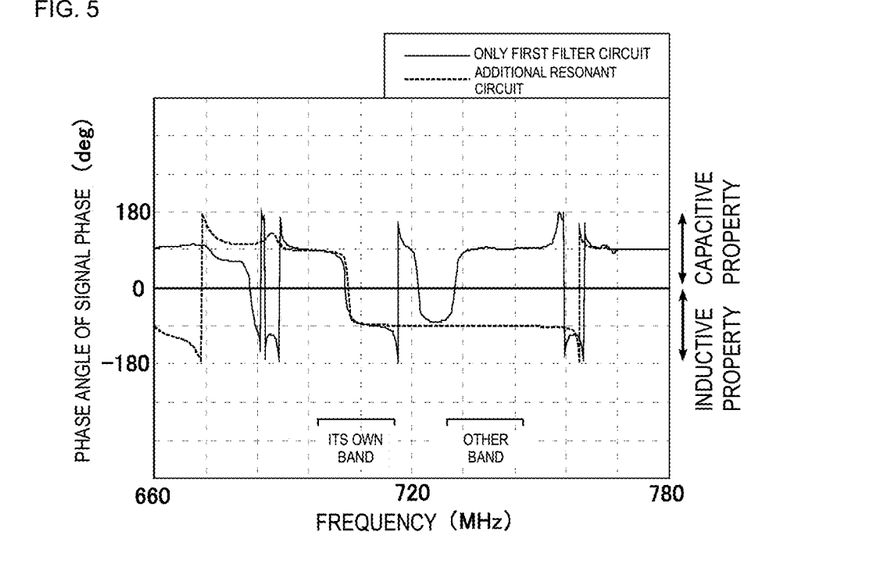
FIG. 5 is a graph illustrating phase characteristics of a first filter circuit and the additional resonant circuit that are included in an acoustic wave filter according to a preferred embodiment of the present invention.

FIG. 4 is a graph illustrating bandpass characteristics of the acoustic wave filter 1. FIG. 5 is a graph illustrating phase characteristics of the first filter circuit 10 and the additional resonant circuit 20 that are included in the acoustic wave filter 1.

In FIGS. 4 and 5, an example is illustrated where the acoustic wave filter 1 is a transmission filter and the second filter circuit 50 is a reception filter. Furthermore, an example is illustrated where the pass band of the acoustic wave filter 1 ranges from about 698 MHz to about 716 MHz and the pass band of the second filter circuit 50 ranges from about 728 MHz to about 746 MHz.

As illustrated in FIG. 4, the additional resonant circuit 20 has a plurality of resonant frequencies. At least one resonant frequency of one or more resonant frequencies that the additional resonant circuit 20 has is included within the pass band of the first filter circuit 10. In FIG. 4, for example, of two resonant frequencies f1 and f2 of the additional resonant circuit 20, the resonant frequency f1 exists within the pass band of the first filter circuit 10. Furthermore, of a plurality of resonant frequencies f1 and f2, the other resonant frequency f2 different from the resonant frequency f1 is outside the pass band of the first filter circuit 10. Specifically, the other resonant frequency f2 is outside the pass band of the second filter circuit 50 and exists in a band of frequencies higher than the pass band of the second filter circuit 50.

Hereinafter, the pass band of the first filter circuit 10 included in the acoustic wave filter 1 may be referred to as its own band, and the pass band of the second filter circuit 50 may be referred to as another band or the other band.

As indicated by phase characteristics in FIG. 5, signal phases that pass through the first filter circuit 10 and the additional resonant circuit 20 are the same in its own band. On the other hand, signal phases that pass through the above-described respective circuits are the same in a certain frequency band in the other band but are opposite in most of a frequency band other than the certain frequency band.

Specifically, as for signal phases that pass through the first filter circuit 10 and the additional resonant circuit 20, when a signal phase of the first filter circuit 10 exhibits a capacitive property in its own band, a signal phase of the additional resonant circuit 20 also exhibits the capacitive property. When a signal phase of the first filter circuit 10 exhibits an inductive property, a signal phase of the additional resonant circuit 20 also exhibits the inductive property. Thus, when a signal that passes through the additional resonant circuit 20 has the same characteristics as a signal that passes through the first filter circuit 10 in terms of the capacitive and inductive properties, the signal that passes through the first filter circuit 10 can be strengthened. That is, signal phases of the first filter circuit 10 and the additional resonant circuit 20 in its own band are made to coincide with each other, thereby enabling a reduction in insertion loss in its own band of the acoustic wave filter 1.

On the other hand, signal phases of the first filter circuit 10 and the additional resonant circuit 20 exhibit the inductive property in a certain frequency band in the other band. However, in about 80% or more of a frequency band other than the certain frequency band, a signal phase of the first filter circuit 10 exhibits the capacitive property, and a signal phase of the additional resonant circuit 20 exhibits the inductive property. In other words, signal phases of the first filter circuit 10 and the additional resonant circuit 20 are opposite rather than the same in most portions (frequency regions) in the other band. Thus, when most of signals that pass through the additional resonant circuit 20 have characteristics opposite to signals that pass through the first filter circuit 10 in terms of the capacitive and inductive properties, a signal that passes through the first filter circuit 10 can be weakened. That is, signal phases of the first filter circuit 10 and the additional resonant circuit 20 in the other band are reversed, thus making it possible to keep the acoustic wave filter 1 from adversely affecting bandpass characteristics in the other band.

Furthermore, when signal phases of the first filter circuit 10 and the additional resonant circuit 20 are compared by using a difference between phase angles, a difference between phase angles of the above-described signal phases in its own band is smaller than a difference between phase angles of the above-described signal phases in the other band. For example, a difference between phase angles of the above-described signal phases in about 80% or more of its own band is about 10° or less, and a difference between phase angles of the above-described signal phases in about 80% or more of the other band is about 90° or more. When there is such a difference between differences between phase angles, a signal that passes through the first filter circuit 10 in its own band can be strengthened, and a signal that passes through the first filter circuit 10 in the other band can be weakened. This enables a reduction in insertion loss in its own band and an improvement in attenuation characteristics in the other band.

Next, bandpass characteristics of the acoustic wave filter 1 that exhibits the above-described characteristics will be described by comparison with bandpass characteristics of an acoustic wave filter in a comparative example.

Figure 6:
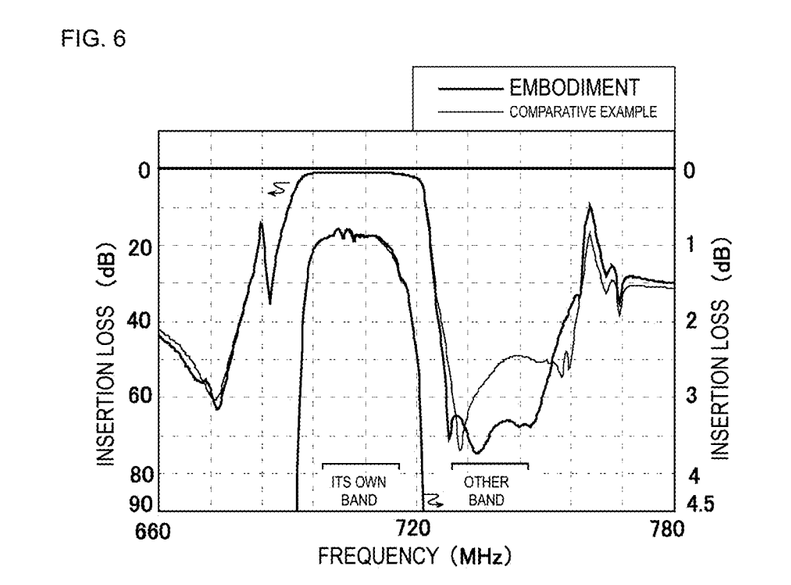
FIG. 6 is a graph illustrating bandpass characteristics of acoustic wave filters in preferred embodiments of the present invention and a comparative example.

FIG. 6 is a graph illustrating bandpass characteristics of acoustic wave filters in the present preferred embodiment and a comparative example. Incidentally, in the comparative example, there is provided an acoustic wave filter including no additional resonant circuit 20, that is, an acoustic wave filter including only the first filter circuit 10.

As illustrated in FIG. 6, in the acoustic wave filter 1 according to the present preferred embodiment, an attenuation slope located at frequencies higher than its own band is steep in comparison with the acoustic wave filter in the comparative example. Furthermore, in the acoustic wave filter 1 according to the present preferred embodiment, attenuation in the other band is great in comparison with the acoustic wave filter in the comparative example. The reason why these characteristics are exhibited is because, as indicated by phase characteristics in FIG. 5, some signal phases of the first filter circuit 10 and the additional resonant circuit 20 are opposite in a transition band (about 716 MHz to about 728 MHz) between its own band and the other band and the other band (about 728 MHz to about 746 MHz). Thus, the acoustic wave filter 1 according to the present preferred embodiment enables an improvement in attenuation characteristics outside the pass band in comparison with the acoustic wave filter in the comparative example.

Next, the amount of improvement in insertion loss in the pass band of the acoustic wave filter 1 will be described.

Figure 7A:
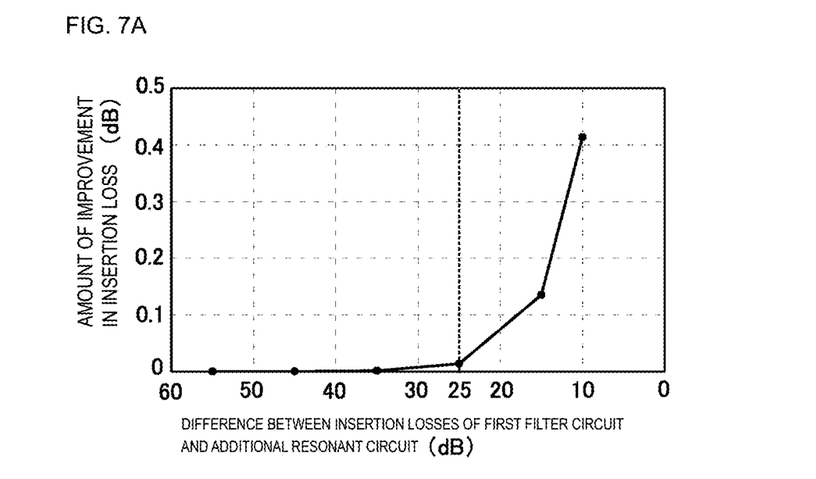
FIG. 7A is a graph illustrating the amount of improvement in insertion loss in a pass band of an acoustic wave filter according to a preferred embodiment of the present invention.
Figure 7B:
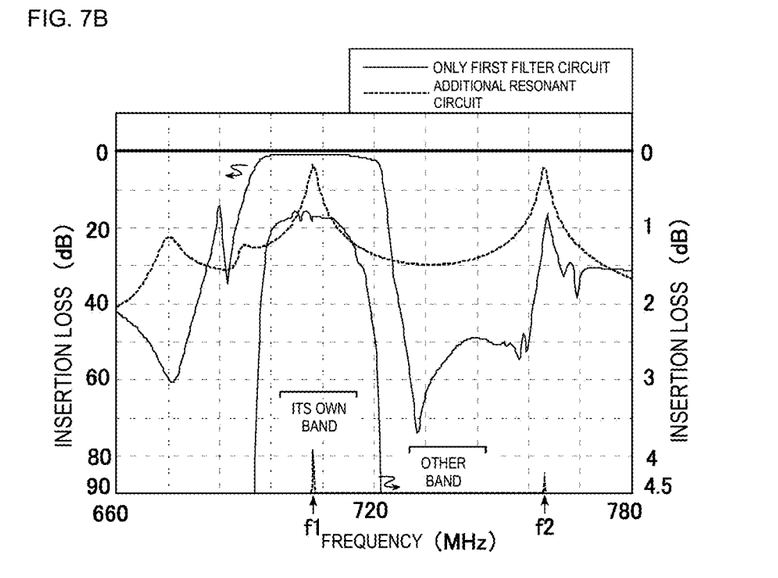
FIG. 7B is a graph illustrating insertion losses of the first filter circuit and the additional resonant circuit in an acoustic wave filter according to a preferred embodiment of the present invention.

FIG. 7A is a graph illustrating the amount of improvement in insertion loss in the pass band of the acoustic wave filter 1. FIG. 7B is a graph illustrating insertion losses of the first filter circuit 10 and the additional resonant circuit 20 in the acoustic wave filter 1.

In FIG. 7A, the vertical axis represents the amount of improvement (dB) in insertion loss of the acoustic wave filter 1 according to the present preferred embodiment with respect to insertion loss of the acoustic wave filter in the comparative example. Referring to FIG. 6 as an example, the amount of improvement in insertion loss is obtained by subtracting, at a frequency (for example, 716 MHz) at which a maximum insertion loss is reached in the pass band of the acoustic wave filter 1, an insertion loss in the comparative example from an insertion loss in the present preferred embodiment. As a difference between the insertion loss in the present preferred embodiment and the insertion loss in the comparative example increases, the degree of improvement in insertion loss increases.

In FIG. 7A, the horizontal axis represents a difference (dB) between insertion losses of the first filter circuit 10 and the additional resonant circuit 20. Referring to FIG. 7B as an example, a difference between insertion losses of the first filter circuit 10 and the additional resonant circuit 20 is obtained by subtracting, at a frequency (for example, about 716 MHz) at which a maximum insertion loss is reached in the pass band, an insertion loss of a signal that passes through the additional resonant circuit 20 from an insertion loss of a signal that passes through the first filter circuit 10. As a difference between the insertion loss of the signal that passes through the first filter circuit 10 and the insertion loss of the signal that passes through the additional resonant circuit 20 decreases (toward the right-hand side of FIG. 7A), the strength of the signal that passes through the additional resonant circuit 20 increases.

As illustrated in FIG. 7A, when a difference between the insertion losses of the first filter circuit 10 and the additional resonant circuit 20 falls below about 25 dB, the amount of improvement in insertion loss represented by the vertical axis increases. That is, it is desirable that a difference between insertion losses of signals that pass through the first filter circuit 10 and the additional resonant circuit 20 be about 25 dB or less within the pass band of the acoustic wave filter 1.

Next, a relationship between a resonant frequency F of series-arm resonators included in the first filter circuit 10 and the resonant frequency f1 of the additional resonant circuit 20 will be described. The resonant frequency F of the series-arm resonators is, for example, a resonant frequency obtained when characteristics of one or more series-arm resonators are averaged. The resonant frequency F in this example is a resonant frequency obtained when characteristics of the series-arm resonators S2 and S3 with which the additional resonant circuit 20 is connected in parallel are averaged.

Figure 8A:
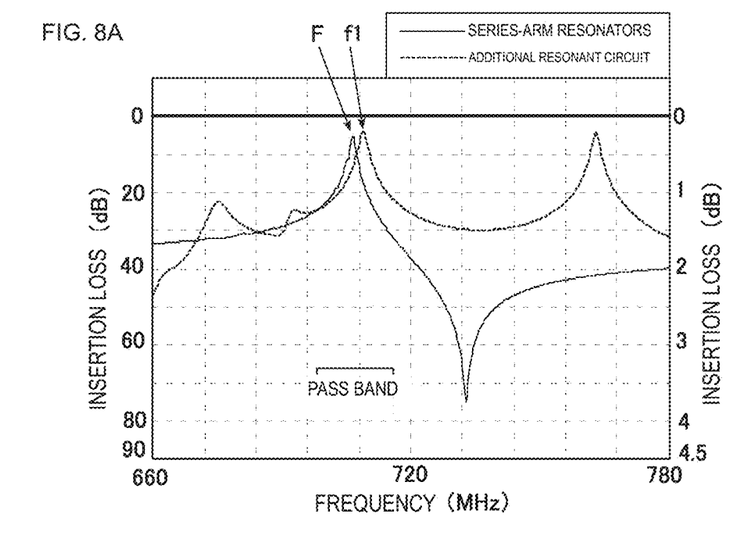
FIGS. 8A and 8B include graphs illustrating an example of insertion losses of series-arm resonators of the first filter circuit and the additional resonant circuit.
Figure 8B:
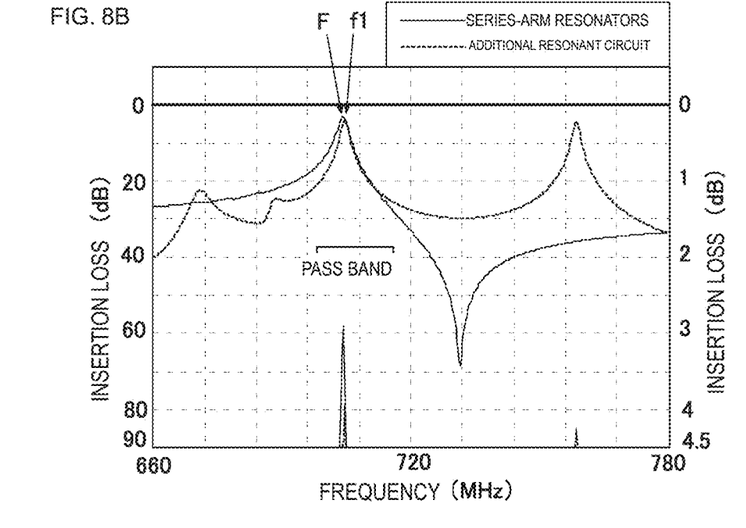
Figure 9A:
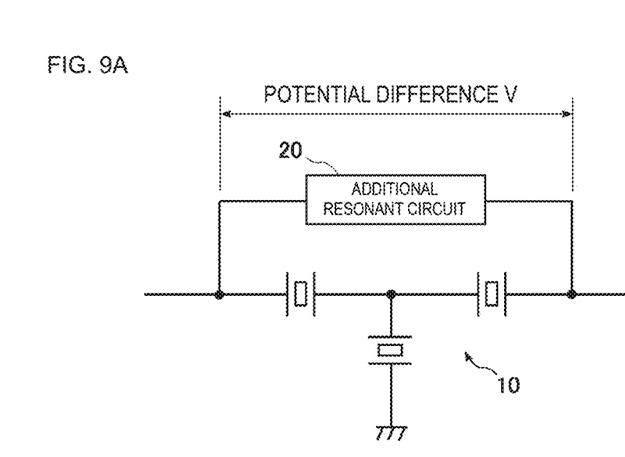
FIGS. 9A and 9B include diagrams illustrating an example of the series-arm resonators of the first filter circuit and the additional resonant circuit.
Figure 9B:
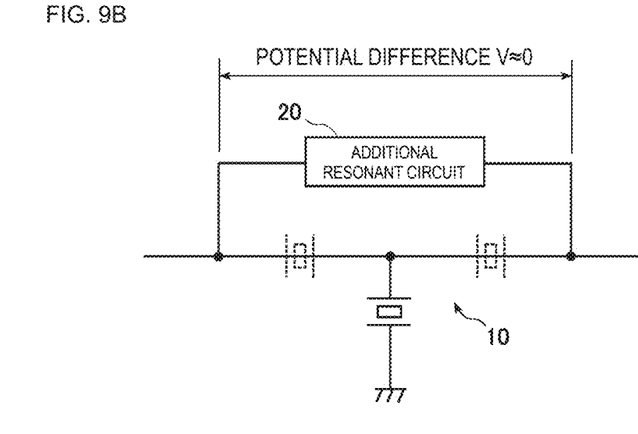

FIGS. 8A and 8B include graphs illustrating an example of insertion losses of series-arm resonators of the first filter circuit 10 and the additional resonant circuit 20. FIGS. 9A and 9B includes diagrams illustrating an example of the series-arm resonators of the first filter circuit 10 and the additional resonant circuit 20. FIGS. 8A and 9A illustrate an example where the resonant frequency F of the series-arm resonators and the resonant frequency f1 of the additional resonant circuit 20 do not coincide with each other. FIGS. 8B and 9B illustrate an example where two resonant frequencies F and f1 coincide with each other.

For example, as illustrated in FIG. 8A, when the resonant frequency f1 of the additional resonant circuit 20 deviates from the resonant frequency F of the series-arm resonators, mismatching is likely to occur between a signal that passes through the first filter circuit 10 and a signal that passes through the additional resonant circuit 20 within the pass band. This is because the series-arm resonators have the property of having high impedance at a frequency different from their own resonant frequency. As illustrated in FIG. 9A, when a signal passes through the series-arm resonators having high impedance, a potential difference V occurs across the additional resonant circuit 20 due to a voltage drop, and the additional resonant circuit 20 is excited by this potential difference V. For this reason, mismatching occurs between the signal that passes through the first filter circuit 10 and the signal that passes through the additional resonant circuit 20.

For example, as illustrated in FIG. 8B, when the resonant frequency f1 of the additional resonant circuit 20 coincides with the resonant frequency F of the series-arm resonators, mismatching is less likely to occur between a signal that passes through the first filter circuit 10 and a signal that passes through the additional resonant circuit 20 within the pass band. This is because the impedance of the series-arm resonators reaches substantially 0 at their own resonant frequency, that is, it is equivalent to the occurrence of a short circuit. As illustrated in FIG. 9B, even when a signal passes through the series-arm resonators whose impedance is substantially 0, a potential difference V is not very likely to occur in the additional resonant circuit 20, and the additional resonant circuit 20 is almost not excited. For this reason, mismatching is less likely to occur between the signal that passes through the first filter circuit 10 and the signal that passes through the additional resonant circuit 20.

Thus, it is desirable that the resonant frequency f1 of the additional resonant circuit 20 coincide with the resonant frequency F of one or more series-arm resonators within the pass band of the first filter circuit 10. Incidentally, the above description in which the resonant frequencies F and f1 coincide with each other means, for example, that the resonant frequency f1 of the additional resonant circuit 20 is located, of resonant frequencies of the one or more series-arm resonators, within a range from a minimum resonant frequency to a maximum resonant frequency.

Furthermore, if the additional resonant circuit 20 has a plurality of resonant frequencies (a plurality of local maxima of insertion loss) within the pass band of the first filter circuit 10, it is desirable that, of the plurality of resonant frequencies, a value of a resonant frequency f1 at which the lowest impedance (or insertion loss) is exhibited be closer to a value of the resonant frequency F of the series-arm resonators than a resonant frequency different from the resonant frequency f1 at which the lowest impedance (or insertion loss) is exhibited. That is, the additional resonant circuit 20 has a plurality of resonant frequencies included within the pass band, and, of the plurality of resonant frequencies, a value of the resonant frequency f1 at which the lowest impedance is exhibited may be closest to a value of the resonant frequency of one or more series-arm resonators.

SUMMARY

As described above, the acoustic wave filter 1 according to the present preferred embodiment includes the first filter circuit (filter circuit) 10 having a predetermined frequency band as a pass band and provided on the first path r1 connecting the first signal terminal T1 and the second signal terminal T2, and the additional resonant circuit 20 connected in parallel with at least a portion of the first filter circuit 10. The additional resonant circuit 20 includes the IDT electrode group 25 including the plurality of IDT electrodes 31 and 32 positioned along the acoustic wave propagation direction D1. At least one resonant frequency f1 of one or more resonant frequencies of the additional resonant circuit 20 is included within the pass band of the first filter circuit 10.

For example, in the existing acoustic wave filter, since the resonant frequency of the cancel circuit is located far away from the pass band, a signal that passes through the cancel circuit is small in the pass band, and it is difficult to strengthen a signal that passes through the first filter circuit 10. In contrast, in the acoustic wave filter 1 according to the present preferred embodiment, since the above-described at least one resonant frequency f1 of the additional resonant circuit 20 is included within the pass band of the first filter circuit 10, a signal that passes through the first filter circuit 10 within the pass band can be strengthened. This enables a reduction in insertion loss within the pass band of the first filter circuit 10.

Furthermore, signal phases of the first filter circuit 10 and the additional resonant circuit 20 may be the same within the pass band.

Thus, when the signal phases are the same, a signal that passes through the first filter circuit 10 can be strengthened. This enables a reduction in insertion loss within the pass band of the first filter circuit 10 with certainty.

Furthermore, the additional resonant circuit 20 may have a plurality of resonant frequencies f1 and f2, and the other resonant frequency f2 different from the at least one resonant frequency f1 may be outside the pass band of the first filter circuit 10.

This acoustic wave filter 1 enables an improvement in attenuation characteristics outside the pass band.

Furthermore, a difference between phase angles of signal phases of the first filter circuit 10 and the additional resonant circuit 20 within the pass band may be smaller than a difference between phase angles of signal phases of the first filter circuit 10 and the additional resonant circuit 20 outside the pass band.

This enables, by using the additional resonant circuit 20, a signal that passes through the first filter circuit 10 within the pass band to be strengthened and enables a signal that passes through the first filter circuit 10 outside the pass band to be weakened. Thus, insertion loss within the pass band can be reduced, and attenuation characteristics outside the pass band can be improved.

Furthermore, a difference between insertion losses of signals that pass through the first filter circuit 10 and the additional resonant circuit 20 may be about 25 dB or less within the pass band.

This enables an increase in the amount of improvement in insertion loss of the acoustic wave filter 1 according to the present preferred embodiment with respect to the acoustic wave filter in the comparative example.

Furthermore, the first filter circuit 10 may include one or more series-arm resonators, and the at least one resonant frequency f1 of the additional resonant circuit 20 may coincide with a resonant frequency F of the one or more series-arm resonators within the pass band.

This causes mismatching between a signal that passes through the first filter circuit 10 and a signal that passes through the additional resonant circuit 20 to be less likely to occur within the pass band and enables a reduction in insertion loss of the first filter circuit 10.

Furthermore, the additional resonant circuit 20 may have a plurality of resonant frequencies included within the pass band, and, of the plurality of resonant frequencies, a value of a resonant frequency f1 at which the lowest impedance is exhibited may be closest to a value of the resonant frequency of the one or more series-arm resonators.

This enables a signal that passes through the first filter circuit 10 to be effectively strengthened. This enables a reduction in insertion loss within the pass band of the first filter circuit 10.

Furthermore, the plurality of IDT electrodes 31 and 32 may be each connected directly to the first path r1 via the second path r2 different from the first path r1.

This enables a signal that passes through the additional resonant circuit 20 to be strengthened and enables a signal that passes through the first filter circuit 10 to be further strengthened. This enables a reduction in insertion loss within the pass band of the first filter circuit 10.

Furthermore, the multiplexer 5 may include the above-described acoustic wave filter 1, the first signal terminal T1, the second signal terminal T2, the third signal terminal T3, and the second filter circuit 50 having, as a pass band, a frequency band different from that of the first filter circuit 10 and disposed on the third path r3 connecting the second signal terminal T2 and the third signal terminal T3. The other resonant frequency f2 different from the resonant frequency f1 may be outside the pass band of the second filter circuit 50. In most portions within the other band of the first filter circuit 10, that is, in most portions within the pass band of the second filter circuit 50, signal phases of the first filter circuit 10 and the additional resonant circuit 20 may be opposite rather than the same.

Other Preferred Embodiments

Acoustic wave filters according to preferred embodiments of the present invention has been described above. As for the present invention, the present invention also encompasses other preferred embodiments achieved by combining any components in the above-described preferred embodiments, modifications obtained by making various modifications to the above-described preferred embodiments within the scope of the present invention, and radio frequency front-end circuits and communication devices that each include an acoustic wave filter or multiplexer according to other preferred embodiments of the present invention.

In the above description, although an example has been described where the IDT electrode group 25 includes two IDT electrodes, the number of IDT electrodes is not limited to this and may be three or more.

In the above description, although an example has been described where the pass band of the acoustic wave filter 1 is lower than the pass band of the second filter circuit 50, the pass band of the acoustic wave filter 1 is not limited to this and may be higher than the pass band of the second filter circuit 50.

In the above description, although an example has been described where the acoustic wave filter 1 is a transmission filter, the acoustic wave filter 1 is not limited to this and may be a reception filter. Furthermore, the multiplexer 5 is not limited to a configuration in which both a transmission filter and a reception filter are included and may include only a transmission filter, or only a reception filter.

Furthermore, in the above description, although, as an example, the multiplexer including two filters has been described, preferred embodiments of the present invention can also be applied, for example, to a triplexer in which a common antenna terminal is provided for three filters, or a hexaplexer in which a common antenna terminal is provided for six filters. That is, the multiplexer may only include two or more filters.

Furthermore, each of the first signal terminal T1 and the second signal terminal T2 may be either an input terminal or an output terminal. For example, if the first signal terminal T1 is an input terminal, the second signal terminal T2 is an output terminal. If the second signal terminal T2 is an input terminal, the first signal terminal T1 is an output terminal.

Furthermore, the second filter circuit 50 is not limited to the above-described filter configuration and can be appropriately designed, for example, in accordance with filter characteristics that are desired. Specifically, the second filter circuit 50 may have a longitudinally coupled filter structure or may have a ladder filter structure. Furthermore, each resonator of the second filter circuit 50 is not limited to a SAW resonator and may be, for example, a BAW (Bulk Acoustic Wave) resonator. Additionally, the second filter circuit 50 may be constructed without any resonators and may be, for example, an LC resonant filter or dielectric filter.

Furthermore, materials of the electrode layer 325 and dielectric layer 326 of the IDT electrodes 31 and 32 and the reflectors 41 and 42 are not limited to the above-described materials. Furthermore, the IDT electrodes 31 and 32 do not have to have the above-described laminated structure. The IDT electrodes 31 and 32 may be made of a metal or alloy, such as Ti, Al, Cu, Pt, Au, Ag, or Pd, or may include a plurality of multilayer bodies made of the above-described metal or alloy.

Furthermore, although a substrate having piezoelectricity has been described as the substrate 320 in the preferred embodiments, this substrate may be a piezoelectric substrate including a single piezoelectric layer. The piezoelectric substrate in this case is made, for example, of a piezoelectric single crystal of $LiTaO_3$, or another piezoelectric single crystal, such as $LiNbO_3$. Furthermore, as for the substrate 320 on which the IDT electrodes 31 and 32 are formed, as long as the substrate 320 has piezoelectricity, a structure in which piezoelectric layers are laminated on a supporting substrate may be used in addition to a structure in which the entire substrate 320 is including a piezoelectric layer. Additionally, a cut-angle of the substrate 320 according to the above-described preferred embodiments is not limited. That is, a laminated structure, materials, and a thickness may be appropriately changed, for example, in accordance with a desired bandpass characteristics of the acoustic wave filter. Even a surface acoustic wave filter in which, for example, a $LiTaO_3$ piezoelectric substrate or $LiNbO_3$ piezoelectric substrate with an angle other than the cut-angle described in the above-described preferred embodiments is used can achieve a similar effect.

Preferred embodiments of the present invention can be widely used, as a multiplexer, a front-end circuit, and a communication device that each include an acoustic wave filter, in communication equipment, such as mobile phones.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter comprising:
    a filter circuit with a predetermined frequency band as a pass band and provided on a first path connecting a first signal terminal and a second signal terminal; and
    an additional resonant circuit connected in parallel with at least a portion of the filter circuit; wherein
    the additional resonant circuit includes an IDT electrode group including at least one longitudinally coupled resonator including a plurality of IDT electrodes positioned adjacent to each other along an acoustic wave propagation direction, each of the plurality of IDT electrodes includes a first comb-shaped electrode and a second comb-shaped electrode; and
    at least one resonant frequency of one or more resonant frequencies of the additional resonant circuit is included within the pass band of the filter circuit.

2. The acoustic wave filter according to claim 1, wherein signal phases of the filter circuit and the additional resonant circuit are the same within the pass band.

3. The acoustic wave filter according to claim 1, wherein the additional resonant circuit includes a plurality of resonant frequencies; and
    another resonant frequency different from the at least one resonant frequency is outside the pass band of the filter circuit.

4. The acoustic wave filter according to claim 3, wherein a difference between phase angles of signal phases of the filter circuit and the additional resonant circuit within the pass band is smaller than a difference between phase angles of signal phases of the filter circuit and the additional resonant circuit outside the pass band.

5. The acoustic wave filter according to claim 1, wherein a difference between insertion losses of signals that pass through the filter circuit and the additional resonant circuit is about 25 dB or less within the pass band.

6. The acoustic wave filter according to claim 1, wherein the filter circuit includes one or more series-arm resonators; and
    the at least one resonant frequency of the additional resonant circuit coincides with a resonant frequency of the one or more series-arm resonators within the pass band.

7. The acoustic wave filter according to claim 6, wherein the additional resonant circuit includes a plurality of the resonant frequencies included within the pass band; and
    of the plurality of the resonant frequencies, a value of a resonant frequency at which a lowest impedance is exhibited is closest to a value of the resonant frequency of the one or more series-arm resonators.

8. The acoustic wave filter according to claim 1, wherein the additional resonant circuit includes a plurality of reflectors.

9. The acoustic wave filter according to claim 1, wherein the additional resonant circuit is operable to cancel a wave outside the pass band of the filter circuit.

10. The acoustic wave filter according to claim 1, wherein the filter circuit has a π-type ladder filter structure.

11. The acoustic wave filter according to claim 1, wherein the plurality of IDT electrodes are each connected directly to the first path via a second path different from the first path.

12. The acoustic wave filter according to claim 11, further comprising a second filter circuit located on a third path connecting the second signal terminal and a third signal terminal.

13. The acoustic wave filter according to claim 12, wherein a pass band of the second filter circuit is different from that of the first filter circuit.

14. The acoustic wave filter according to claim 13, wherein the pass band of the acoustic wave filter is from about 698 MHz to about 716 MHz and the pass band of the second filter circuit ranges from about 728 MHz to about 746 MHz.

15. The acoustic wave filter according to claim 13, wherein the pass band of the acoustic wave filter is less than the pass band of the second filter circuit.

16. The acoustic wave filter according to claim 1, wherein the acoustic wave filter is one of a transmission filter or a reception filter.

17. A multiplexer comprising the acoustic wave filter according to claim 1.

18. The multiplexer according to claim 17, wherein the multiplexer is a splitter or a combiner.

19. The multiplexer according to claim 17, wherein the multiplexer includes at least two filters.

20. The multiplexer according to claim 17, wherein the multiplexer is a triplexer or a hexaplexer.

* * * * *